(12) United States Patent
Otsuki

(10) Patent No.: US 11,085,711 B2
(45) Date of Patent: Aug. 10, 2021

(54) COOLING DEVICE

(71) Applicants: NIDEC SANKYO CORPORATION, Nagano (JP); Ablecom Technology Inc., New Taipei (TW)

(72) Inventor: Noboru Otsuki, Nagano (JP)

(73) Assignees: NIDEC SANKYO CORPORATION, Nagano (JP); Ablecom Technology Inc., Taoyuan (TW)

( * ) Notice: Subject to any disclaimer, the term of this patent is extended or adjusted under 35 U.S.C. 154(b) by 19 days.

(21) Appl. No.: 16/275,326

(22) Filed: Feb. 14, 2019

(65) Prior Publication Data
US 2019/0249939 A1    Aug. 15, 2019

(30) Foreign Application Priority Data
Feb. 14, 2018   (JP) .............................. JP2018-023710

(51) Int. Cl.
F28F 19/00    (2006.01)

(52) U.S. Cl.
CPC ........ F28F 19/002 (2013.01); *F28F 2230/00* (2013.01); *F28F 2250/08* (2013.01)

(58) Field of Classification Search
CPC ............... F28D 1/05316; F28F 19/002; F28F 2250/08; F28F 2230/00; F28F 1/126; G06F 1/20; G06F 2200/201; H05K 7/20772; H05K 7/20272; H01L 23/473
See application file for complete search history.

(56) References Cited

U.S. PATENT DOCUMENTS

| | | | | |
|---|---|---|---|---|
| 3,810,722 A | * | 5/1974 | Jeandel | F02B 53/00 418/195 |
| 4,201,524 A | * | 5/1980 | Wilkins | F02B 65/00 123/1 R |
| 4,328,769 A | * | 5/1982 | Fujikawa | F01P 5/10 123/198 C |
| 4,333,309 A | * | 6/1982 | Coronel | F01K 23/06 415/114 |
| 4,385,594 A | * | 5/1983 | Hauser, Jr. | F01P 3/20 123/41.29 |
| 4,746,269 A | * | 5/1988 | Raab | F04D 29/126 277/408 |

(Continued)

FOREIGN PATENT DOCUMENTS

| | | |
|---|---|---|
| JP | 2005228237 | 8/2005 |
| JP | 2010007642 | 1/2010 |

*Primary Examiner* — Ljiljana V. Ciric
(74) *Attorney, Agent, or Firm* — JCIPRNET

(57) ABSTRACT

A cooling device having a centrifugal pump directly mounted on a radiator. An annular seal member is disposed between the bottom portion of the case body of the centrifugal pump and the side surface of the tank chamber of the radiator, and the annular seal member is used for preventing the cooling medium leakage via a space between the centrifugal pump and the tank chamber. The cylindrical portion of the case body and the annular seal member are overlapped with each other in the axial direction of the rotation center shaft of the motor that drives the centrifugal pump, in order that the cylindrical portion can receive at least a part of the reaction force of the annular seal member crushed between the case body and the tank chamber, and thereby the bottom portion of the case body of the centrifugal pump is prevented from deformation.

9 Claims, 6 Drawing Sheets

(56) References Cited

U.S. PATENT DOCUMENTS

| | | | | |
|---|---|---|---|---|
| 4,944,653 A * | 7/1990 | Wilkes | F04D 29/042 | 415/170.1 |
| 5,372,098 A * | 12/1994 | Borsboom | F01P 3/20 | 123/41.44 |
| 5,443,369 A * | 8/1995 | Martin | F04D 29/102 | 417/313 |
| 5,713,719 A * | 2/1998 | Fiore | F04D 29/426 | 415/111 |
| 6,026,891 A * | 2/2000 | Fujiyoshi | F28D 15/0233 | 165/104.33 |
| 6,099,243 A * | 8/2000 | Fiore | F16J 15/3404 | 415/111 |
| 6,119,767 A * | 9/2000 | Kadota | F28D 15/0233 | 165/104.33 |
| 6,149,384 A * | 11/2000 | Feres | F04D 1/12 | 415/169.1 |
| 6,175,173 B1 * | 1/2001 | Stephan | H02K 5/1285 | 310/87 |
| 6,208,512 B1 * | 3/2001 | Goldowsky | F04D 3/02 | 165/104.33 |
| 6,293,121 B1 * | 9/2001 | Labrador | B01D 61/10 | 62/304 |
| 6,839,234 B2 * | 1/2005 | Niwatsukino | F28D 15/0266 | 165/80.3 |
| 7,146,822 B2 * | 12/2006 | Stewart | G06F 1/20 | 62/259.2 |
| 7,360,583 B2 * | 4/2008 | Liu | H01L 23/473 | 165/104.33 |
| 7,418,996 B2 * | 9/2008 | Liu | H01L 23/473 | 165/104.19 |
| 7,770,630 B2 * | 8/2010 | Chesser | H05K 7/20009 | 165/65 |
| 7,789,202 B2 * | 9/2010 | Lee | F04C 23/008 | 184/6.2 |
| 7,813,129 B2 * | 10/2010 | Van Der Werff | G06F 1/20 | 361/695 |
| 9,065,313 B2 * | 6/2015 | Chang | F28D 15/0208 | |
| 9,071,100 B2 * | 6/2015 | Chang | F28D 15/0233 | |
| 9,555,174 B2 * | 1/2017 | Franano | A61M 60/205 | |
| 9,662,431 B2 * | 5/2017 | Franano | A61M 1/3653 | |
| 2002/0121089 A1 * | 9/2002 | Filippone | F02G 5/00 | 60/608 |
| 2003/0051859 A1 * | 3/2003 | Chesser | F28D 15/043 | 165/46 |
| 2003/0214786 A1 * | 11/2003 | Niwatsukino | H01L 23/473 | 361/699 |
| 2004/0040695 A1 * | 3/2004 | Chesser | F28D 15/0266 | 165/104.21 |
| 2004/0042176 A1 * | 3/2004 | Niwatsukino | F28D 15/0266 | 361/699 |
| 2004/0123614 A1 * | 7/2004 | Stewart | G06F 1/20 | 62/259.2 |
| 2004/0240179 A1 * | 12/2004 | Koga | H01L 23/473 | 361/699 |
| 2005/0117298 A1 * | 6/2005 | Koga | H01L 23/473 | 361/699 |
| 2006/0120045 A1 * | 6/2006 | Van Der Werff | G06F 1/20 | 361/697 |
| 2006/0144568 A1 * | 7/2006 | Crocker | F04D 29/186 | 165/104.33 |
| 2006/0144569 A1 * | 7/2006 | Crocker | F28F 3/12 | 165/104.33 |
| 2006/0144570 A1 * | 7/2006 | Crocker | F28F 3/12 | 165/104.33 |
| 2007/0000268 A1 * | 1/2007 | Crocker | H01L 23/473 | 62/259.2 |
| 2007/0000648 A1 * | 1/2007 | Crocker | F04D 29/588 | 165/104.33 |
| 2007/0102251 A1 * | 5/2007 | Laukemann | B60T 10/02 | 188/296 |
| 2007/0131182 A1 * | 6/2007 | Mirabile | F02C 5/06 | 123/44 E |
| 2008/0236794 A1 * | 10/2008 | St. Louis | H01L 23/473 | 165/104.19 |
| 2010/0065258 A1 * | 3/2010 | Blomquist | F28F 9/026 | 165/104.34 |
| 2010/0180631 A1 * | 7/2010 | Roisin | F04D 29/582 | 62/498 |
| 2012/0312392 A1 * | 12/2012 | Muhs | F04C 11/005 | 137/334 |
| 2012/0328455 A1 * | 12/2012 | Mann | F04D 25/04 | 417/375 |
| 2016/0241112 A1 * | 8/2016 | Shatek | F04D 29/281 | |
| 2017/0072766 A1 * | 3/2017 | Gilley | F28D 11/04 | |
| 2018/0228040 A1 * | 8/2018 | Lykke | F28F 13/12 | |
| 2020/0393200 A1 * | 12/2020 | Lin | F01P 5/02 | |

* cited by examiner

US 11,085,711 B2

COOLING DEVICE

CROSS-REFERENCE TO RELATED APPLICATION

This application claims the priority of Japan patent application serial No. 2018-023710, filed on Feb. 14, 2018. The entirety of the above-mentioned patent application is hereby incorporated by reference herein and made a part of this specification.

BACKGROUND

Technical Field

The disclosure relates to a cooling device which cools heat-generating components such as electronic components.

Description of Related Art

Conventionally, a cooling device (cooling system) for cooling a central processing unit (CPU) is known (refer to, for example, Patent Document 1). The cooling device described in Patent Document 1 includes a heat receiving jacket on which a CPU is mounted and through which a cooling medium passes, a radiator portion which cools the cooling medium heated by the heat receiving jacket, and two circulation pumps which circulate the cooling medium between the heat receiving jacket and the radiator portion. The two circulation pumps are connected in series via a tube. One circulation pump of the two circulation pumps and the radiator portion are connected via a tube, and the other circulation pump and the heat receiving jacket are connected via a tube. Also, the heat receiving jacket and the radiator portion are connected via a tube.

Further, conventionally, a centrifugal pump (pump device) including a motor having a rotor and a stator, and an impeller fixed to the rotor is known (refer to, for example, Patent Document 2). An outer shell of the centrifugal pump described in Patent Document 2 is comprised of a housing which is formed in a bottomed cylindrical shape and covers the stator, and a case body which covers an opening side of the housing. A pump chamber through which a fluid passes is formed between the housing and the case body.

Further, in the centrifugal pump described in Patent Document 2, the motor includes a fixed shaft which rotatably supports the rotor. One end of the fixed shaft is held by the case body, and the other end of the fixed shaft is held by the housing. A thrust bearing for supporting the rotor in an axial direction of the fixed shaft is mounted on both ends of the fixed shaft. A sleeve constituting a part of the rotor is disposed between the two thrust bearings. A clearance (thrust play) is formed between at least one thrust bearing of the two thrust bearings and the sleeve.

Further, in the centrifugal pump described in Patent Document 2, the case body is formed in a bottomed cylindrical shape of which a housing side is open and includes a cylindrical portion formed in a cylindrical shape and a bottom portion which closes one end of the cylindrical portion. An inlet port through which the fluid is introduced and an outlet port through which the fluid is discharged are formed in the case body. A tip end of the inlet port serves as a suction port for the fluid. The inlet port is disposed at the center of the bottom portion. Also, the inlet port is disposed coaxially with the fixed shaft. In addition, a shaft holding portion which holds one end of the fixed shaft is formed in the case body. The shaft holding portion is integrally formed with the bottom portion and is connected to a center portion of the bottom portion.

PATENT DOCUMENTS

[Patent Document 1] Japanese Unexamined Patent Application, First Publication No. 2005-228237
[Patent Document 2] Japanese Unexamined Patent Application, First Publication No. 2010-7642

The inventor of the present application has studied fixing a centrifugal pump directly to a side surface of a radiator in a cooling device for cooling a heat-generating component such as a CPU. Specifically, the fixing the centrifugal pump directly to the side face of the radiator is considered so that the suction port of the centrifugal pump faces the radiator side. Further, the inventor of the present application has studied fixing a centrifugal pump having a suction port and a discharge port and having a case body formed in a bottomed cylindrical shape to a side surface of a radiator, like in the centrifugal pump described in Patent Document 2, for example.

Also, the inventor of the present application has studied reducing a thickness of the centrifugal pump in the axial direction of the fixed shaft to minimize a protruding amount of the centrifugal pump from the side surface of the radiator and also has studied making the bottom portion of the case body thin. Furthermore, the inventor of the present application has studied placing an annular seal member such as an O-ring between the bottom portion of the case body of the centrifugal pump in which the suction port is formed and the side surface of the radiator to prevent leakage of the cooling medium from a space between the radiator and the centrifugal pump.

However, according to the study of the inventor of the present application, it has become clear that, when the seal member is disposed between the bottom portion of the thin case body and the side surface of the radiator, the bottom portion may be deformed toward the inside of the centrifugal pump by a reaction force of the seal member crushed between the bottom portion of the case body and the side surface of the radiator. Also, the inventor of the disclosure has clarified that, when the bottom portion is deformed toward the inside of the centrifugal pump, the shaft holding portion integrally formed with the bottom portion is shifted to the inside of the centrifugal pump, the thrust play between the sleeve and the thrust bearing is eliminated, and thus the rotor and the impeller may not rotate.

Therefore, an objective of the disclosure is to provide a cooling device having a centrifugal pump directly mounted on a side surface of a radiator and capable of curbing deformation of a bottom portion of a case body of which a thickness is reduced even when an annular seal member for preventing leakage of a cooling medium is disposed between the bottom portion of the case body of the centrifugal pump formed in a bottomed cylindrical shape and the side surface of the radiator.

SUMMARY

A cooling device of the disclosure includes a cooling body which is mounted on a heat-generating component and through which a cooling medium as a cooling liquid passes, a radiator which cools the cooling medium heated by the cooling body, and a centrifugal pump which circulates the cooling medium between the cooling body and the radiator, wherein the radiator includes a plurality of cooling pipes through which the cooling medium passes, a plurality of heat radiation fins connected to outer peripheral surfaces of the cooling pipes, and a tank chamber to which ends of the plurality of cooling pipes are connected, the centrifugal pump includes a motor having a rotor and a stator, an impeller fixed to the rotor and rotated by power of the motor, and a case body in which a suction port and a discharge port of the cooling medium are formed, the motor has a rotation center shaft serving as a rotation center of the rotor and the impeller, assuming that toward one side of the rotation center shaft in an axial direction is a first direction and a direction opposite to the first direction is a second direction, the case body is formed in a bottomed cylindrical shape which has a cylindrical portion formed in a cylindrical shape and a bottom portion configured to close one end of the cylindrical portion, an axial direction of the cylindrical portion formed in a cylindrical shape coincides with the axial direction of the rotation center shaft, the bottom portion closes an end of the cylindrical portion in the first direction, a shaft holding portion which holds an end of the rotation center shaft in the first direction is formed in the case body, a through-hole which passes through the bottom portion in the axial direction of the rotation center shaft and through which the cooling medium suctioned from the suction port passes is formed at a center of the bottom portion, the shaft holding portion is disposed on a side of the bottom portion in the second direction and is connected to a center portion of the bottom portion, the centrifugal pump is fixed to the tank chamber in a state in which a bottom surface of the bottom portion on a side in the first direction faces a side surface of the tank chamber on a side in the second direction, an annular seal member which prevents leakage of the cooling medium from a space between the centrifugal pump and the tank chamber is disposed between the bottom surface of the bottom portion and the side surface of the tank chamber to surround the through-hole, and an inner peripheral surface of the cylindrical portion connected to a surface of the bottom portion on a side in the second direction and the seal member overlap each other when seen in the axial direction of the rotation center shaft.

DESCRIPTION OF THE EMBODIMENTS

Hereinafter, embodiments of the disclosure will be described with reference to the drawings.

(Configuration of Cooling Device)

Figure 1:
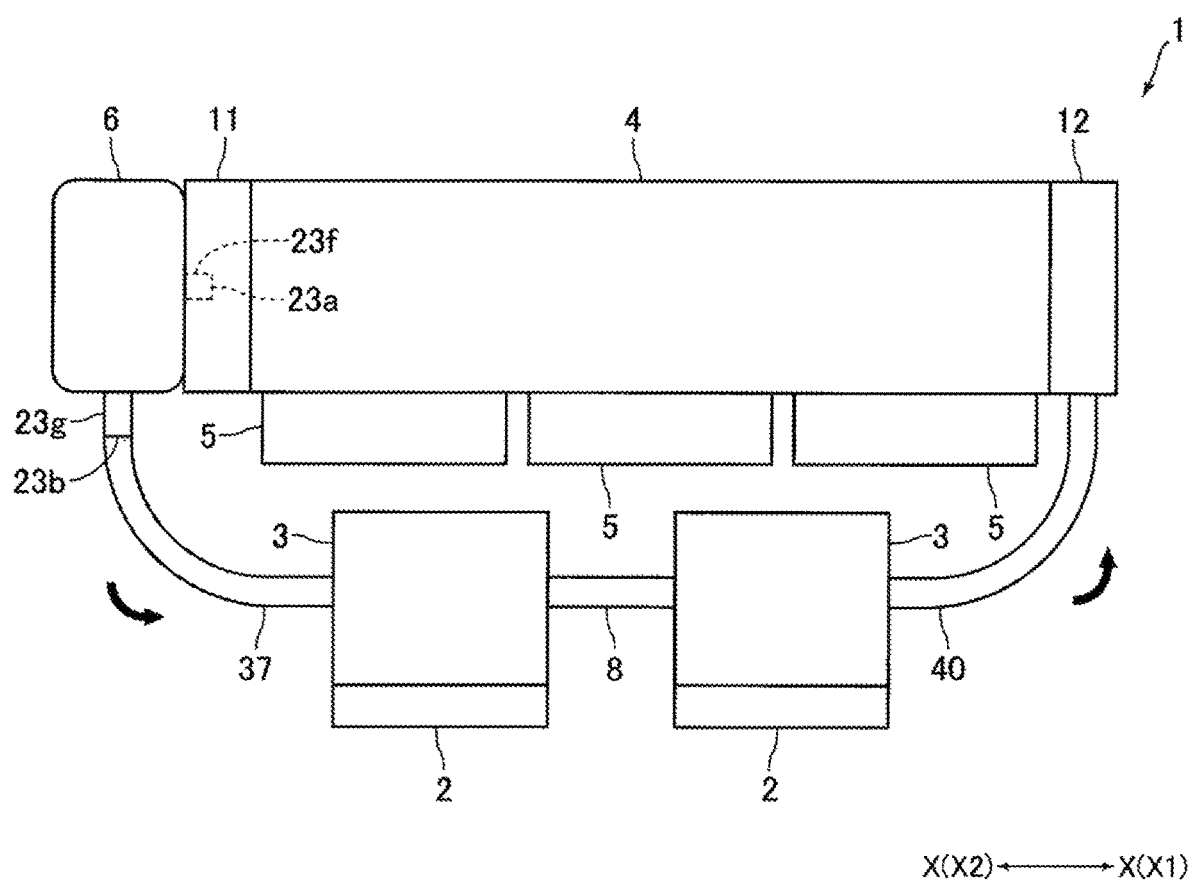
FIG. 1 is a schematic view for explaining a configuration of a cooling device according to an embodiment of the disclosure.
Figure 2:
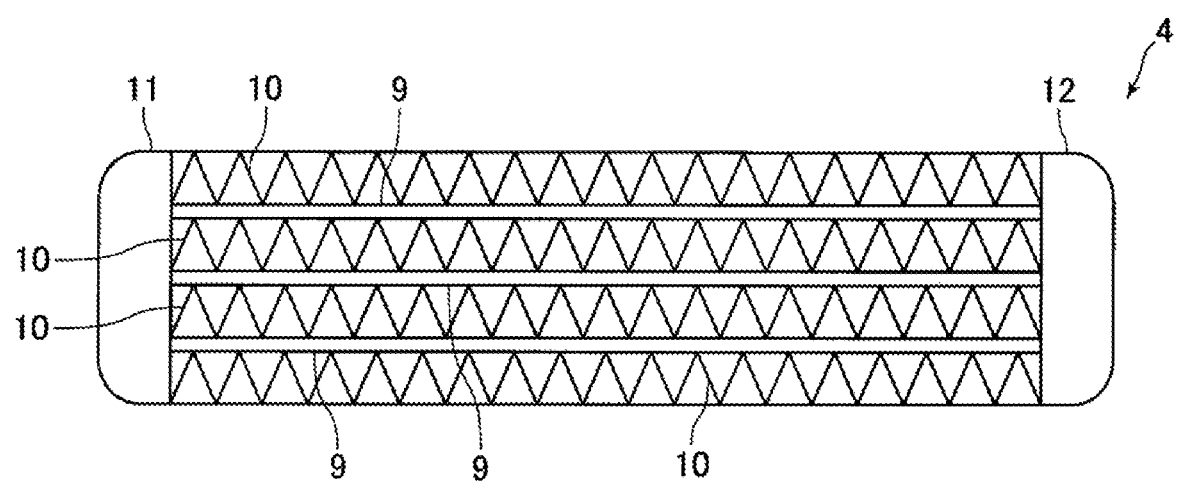
FIG. 2 is a schematic view for explaining a configuration of a radiator shown in FIG. 1.
Figure 3:
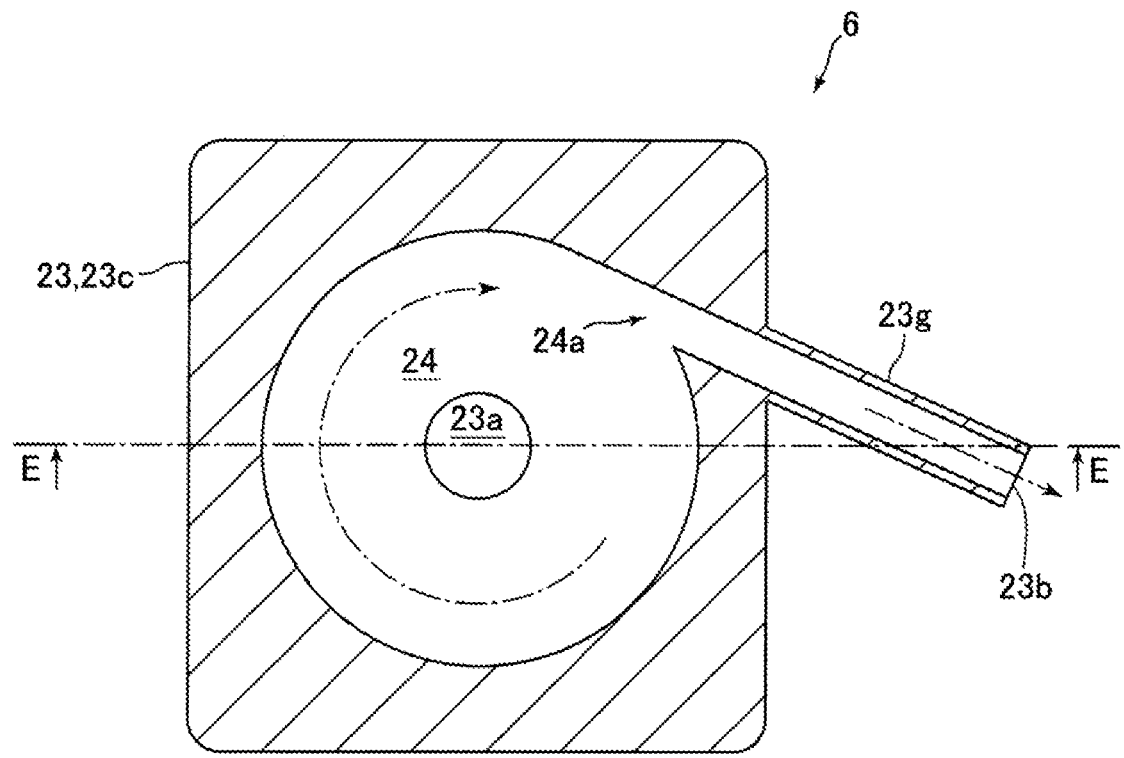
FIG. 3 is a cross-sectional view for explaining a mounting direction of a centrifugal pump shown in FIG. 1.
Figure 4:
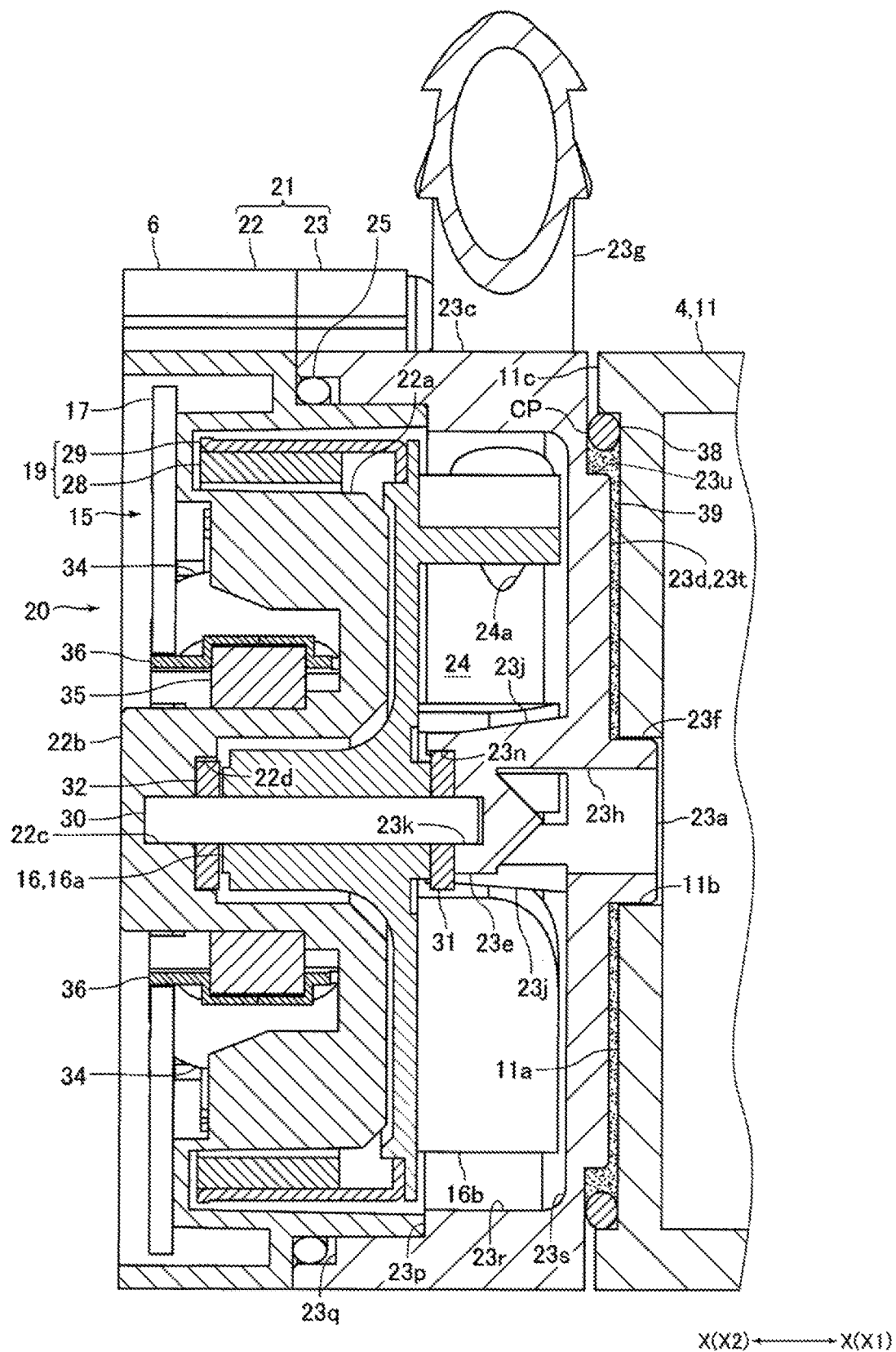
FIG. 4 is a cross-sectional view for explaining a configuration of the centrifugal pump shown in FIG. 1 and a configuration of a connecting portion between the centrifugal pump and a tank chamber.
Figure 5:
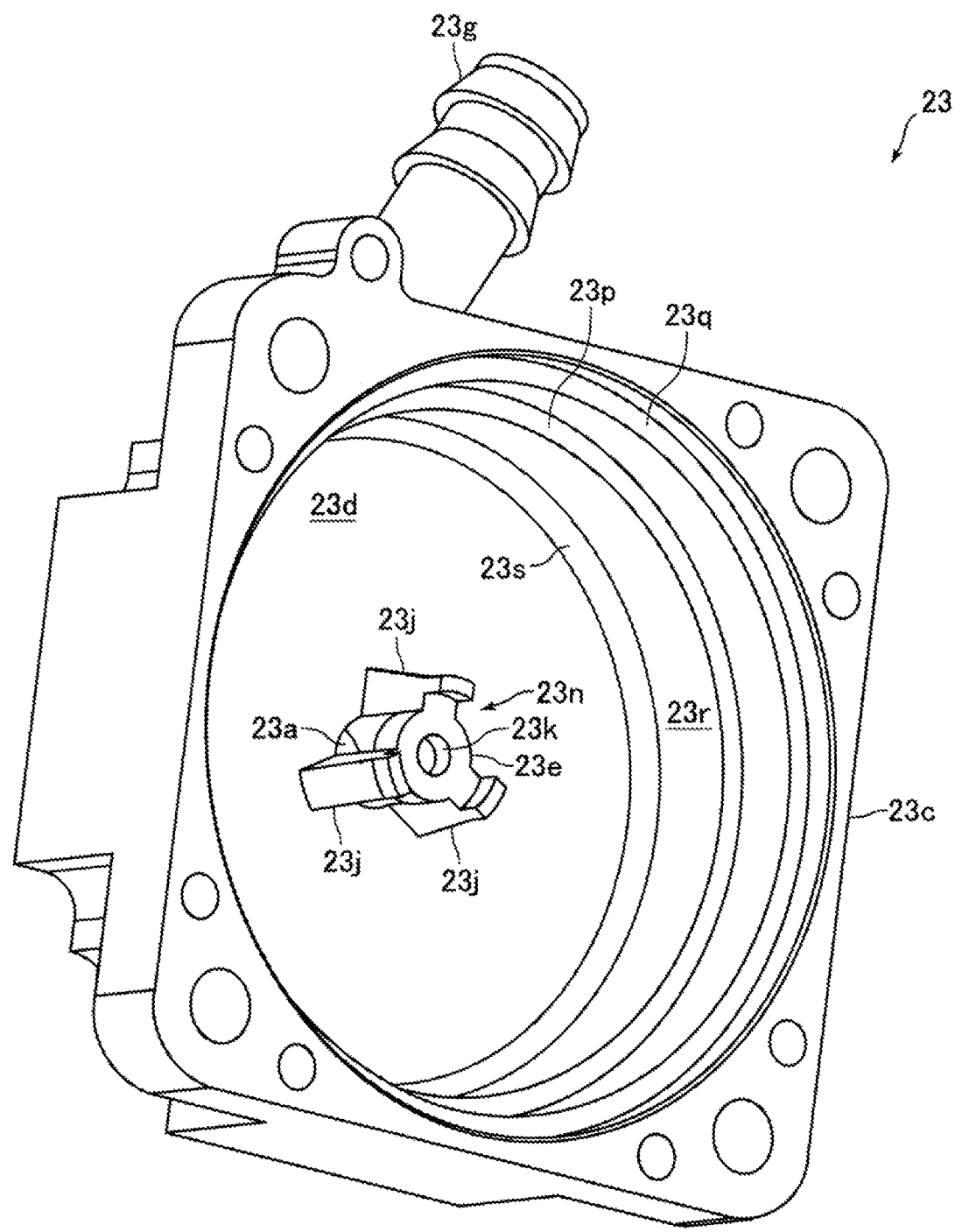
FIG. 5 is a perspective view of a case body shown in FIG. 4.

FIG. 1 is a schematic view for explaining a configuration of a cooling device 1 according to an embodiment of the disclosure. FIG. 2 is a schematic view for explaining a configuration of a radiator 4 shown in FIG. 1. FIG. 3 is a cross-sectional view for explaining a mounting direction of a centrifugal pump 6 shown in FIG. 1. FIG. 4 is a cross-sectional view for explaining a configuration of the centrifugal pump 6 shown in FIG. 1 and a configuration of a connecting portion between the centrifugal pump 6 and a tank chamber 11. FIG. 5 is a perspective view of a case body 23 shown in FIG. 4. In FIG. 4, a cross section corresponding to an E-E cross section of FIG. 3 is shown.

The cooling device 1 of the embodiment is a device for cooling a heat-generating component 2. Specifically, the cooling device 1 is a device for cooling two heat-generating components 2. The heat-generating components 2 of the embodiment are electronic components. Specifically, one heat-generating component 2 of the two heat-generating components 2 is a CPU, and the other heat-generating component 2 is a graphics processing unit (GPU). The cooling device 1 of the embodiment is mounted and used in a server. The cooling device 1 may be mounted and used in a personal computer.

The cooling device 1 includes two cooling bodies 3 mounted on the heat-generating components 2 and through which a cooling medium as a cooling liquid passes, a radiator 4 which cools the cooling medium heated by the cooling bodies 3, a plurality of cooling fans 5 mounted on the radiator 4, and a centrifugal pump 6 which circulates the cooling medium between the cooling bodies 3 and the radiator 4. The cooling medium is, for example, cooling water. However, the cooling medium may be a liquid other than the cooling water.

Each of the cooling bodies 3 is a cooling plate formed in a flat plate shape. One surface of the cooling body 3 formed in a flat plate shape is in contact with the heat-generating component 2. A flow passage through which the cooling medium passes is formed inside the cooling body 3. The two cooling bodies 3 are connected in series to the radiator 4. Specifically, the two cooling bodies 3 are connected in series via a pipe 8 formed of a resin tube or the like.

The radiator 4 is formed in an elongated rectangular parallelepiped shape. The radiator 4 is disposed so that a longitudinal direction of the radiator 4 and a horizontal direction coincide with each other. That is, the longitudinal direction of the radiator 4 coincides with the horizontal direction. The radiator 4 includes a plurality of cooling pipes 9 through which the cooling medium passes, a plurality of heat radiation fins 10 connected to an outer peripheral surface of the cooling pipe 9, a tank chamber 11 to which one ends of the plurality of cooling pipes 9 are connected, and a tank chamber 12 to which the other ends of the plurality of cooling pipes 9 are connected.

In the following description, the longitudinal direction of the radiator 4 (an X direction in FIG. 1 and so on) is referred to as "right and left directions." Also, one of the right and left directions (X1 direction in FIG. 1 and so on) is referred to as "right direction," and the opposite direction as an X2 direction in FIG. 1 and so on is referred to as "left direction." In the embodiment, left ends of the plurality of cooling pipes 9 are connected to the tank chamber 11 and right ends of the plurality of cooling pipes 9 are connected to the tank chamber 12.

The radiator 4 of the embodiment includes, for example, three cooling pipes 9. Each of the cooling pipes 9 is formed in an elongated linear shape. A longitudinal direction of the cooling pipe 9 coincides with the right and left directions (that is, the longitudinal direction of the radiator 4). A cross-sectional shape of the cooling pipe 9 is a flat elliptical shape. The tank chamber 11 constitutes one end of the radiator 4 in the longitudinal direction of the radiator 4, and the tank chamber 12 constitutes the other end of the radiator 4 in the longitudinal direction of the radiator 4. That is, the tank chamber 11 constitutes a left end of the radiator 4, and the tank chamber 12 constitutes a right end of the radiator 4.

The tank chambers 11 and 12 are formed in a hollow shape. The inner peripheral side of the cooling pipes 9 communicates with the inside of the tank chambers 11 and 12. The cooling medium before passing through the cooling pipes 9 is accumulated in the tank chamber 12. Further, the cooling medium after passing through the cooling pipes 9 is accumulated in the tank chamber 11. The plurality of fans 5 are fixed to the radiator 4 and blow air toward the plurality of fins 10.

The centrifugal pump 6 is a type of pump called a canned pump (canned motor pump). As shown in FIG. 4, the centrifugal pump 6 includes a motor 15, an impeller 16 which rotates by power of the motor 15, and a circuit board 17 which controls the motor 15. The motor 15 is a DC brushless motor. The motor 15 includes a rotor 19 and a stator 20. The motor 15 of the embodiment is an outer rotor type motor. The impeller 16 is accommodated in a pump case 21. The pump case 21 is comprised of a motor case 22 constituting a part of the motor 15 and a case body 23 fixed to the right end side of the motor case 22.

A suction port 23a for a cooling medium and a discharge port 23b for a cooling medium are formed in the case body 23. A pump chamber 24 through which the cooling medium suctioned from the suction port 23a passes toward the discharge port 23b is formed inside the pump case 21. That is, the pump chamber 24 is formed in the centrifugal pump 6. An annular seal member 25 which ensures sealing performance of the pump chamber 24 is disposed at a joint portion between the motor case 22 and the case body 23. The seal member 25 is an O-ring. The motor case 22 and the case body 23 are fixed to each other by screws.

The rotor 19 includes a driving magnet 28 formed in a cylindrical shape, and a cylindrical magnet holding member 29 to which the driving magnet 28 is fixed. The driving magnet 28 is fixed to the inner peripheral surface of the magnet holding member 29. N poles and S poles are alternately magnetized in the circumferential direction on the inner peripheral surface of the driving magnet 28. The cylindrical magnet holding member 29 is disposed so that the axial direction and the right and left directions of the magnet holding member 29 coincide with each other. The impeller 16 is fixed to the right end of the magnet holding member 29. That is, the impeller 16 is fixed to the rotor 19. The impeller 16 and the rotor 19 are disposed inside the pump chamber 24.

The impeller 16 and the rotor 19 are rotatably supported by a fixed shaft 30. That is, the motor 15 includes the fixed shaft 30 which rotatably supports the impeller 16 and the rotor 19. The impeller 16 and the rotor 19 rotate about the fixed shaft 30 as a rotation center. The fixed shaft 30 of the embodiment is a rotation center shaft which is the rotation center of the impeller 16 and the rotor 19. The fixed shaft 30 is disposed so that the axial direction and the right and left directions of the fixed shaft 30 coincide with each other. That is, the right and left directions (the X direction) are the axial direction of the fixed shaft 30. Further, the right direction (the X1 direction) of the embodiment is a first direction which is a direction toward one side of the axial direction of the fixed shaft 30, and the left direction (the X2 direction) is a second direction which is the opposite direction of the first direction.

A bearing portion 16a through which the fixed shaft 30 is inserted is formed in the impeller 16. The bearing portion 16a is formed in a cylindrical shape, and the fixed shaft 30 is inserted through the inner peripheral side of the bearing portion 16a. The right end of the fixed shaft 30 is held by the case body 23, and a left end of the fixed shaft 30 is held by the motor case 22. A thrust bearing 31 is disposed between the case body 23 and the bearing portion 16a, and a thrust bearing 32 is disposed between the motor case 22 and the bearing portion 16a. The thrust bearings 31 and 32 are sliding bearings formed in a flat plate shape.

A blade forming portion 16b in which a plurality of blades are formed is formed in the impeller 16. The blade forming portion 16b is connected to a right end of the bearing portion 16a. Further, the blade forming portion 16b spreads radially outward from the right end of the bearing portion 16a. The outer peripheral side portion of the blade forming portion 16b is fixed to a right end of the magnet holding member 29.

The stator 20 is disposed on the inner peripheral side of the driving magnet 28. The stator 20 includes a plurality of driving coils 34 and a stator core 35. The driving coils 34 are wound around a salient pole portion of the stator core 35 via an insulator 36 formed of an insulating material such as a resin. Further, the driving coils 34 are electrically connected to the circuit board 17. The circuit board 17 and the stator core 35 are fixed to the motor case 22. The circuit board 17 and the stator 20 are covered with a potting resin.

The motor case 22 includes a partition wall 22a disposed between the pump chamber 24 and the stator 20 to separate the pump chamber 24 from the stator 20, and a shaft holding portion or shaft holder 22b which holds a left end of the fixed shaft 30. The partition wall 22a serves to prevent the cooling medium from flowing into the pump chamber 24 toward a place in which the stator 20 and the circuit board 17 are disposed. The shaft holding portion 22b is disposed at the center of the motor 15 in the radial direction and is connected to the partition wall 22a. An insertion hole 22c into which the left end of the fixed shaft 30 is inserted and a recessed portion 22d in which the thrust bearing 32 is held are formed in a right end surface of the shaft holding portion 22b. The thrust bearing 32 is disposed between the bearing portion 16a of the impeller 16 and the shaft holding portion 22b in the right and left directions.

The case body 23 is formed in a bottomed cylindrical shape which has a cylindrical portion 23c formed in a cylindrical shape and a bottom portion 23d closing one end of the cylindrical portion 23c. The axial direction of the cylindrical portion 23c formed in a cylindrical shape coincides with the right and left directions. That is, the axial direction of the cylindrical portion 23c coincides with the axial direction of the fixed shaft 30. The bottom portion 23d closes a right end of the cylindrical portion 23c. A thickness (thickness in the right and left directions) of the bottom portion 23d is formed relatively thin. The inner peripheral side of the cylindrical portion 23c and the left side of the bottom portion 23d constitute the pump chamber 24. The case body 23 includes a shaft holding portion or shaft holder 23e which holds the right end of the fixed shaft 30, a cylindrical suction port forming portion 23f in which a suction port 23a is formed at a tip thereof, and a cylindrical discharge port forming portion 23g in which a discharge port 23b is formed at a tip end thereof.

The discharge port forming portion 23g protrudes from the outer peripheral surface of the cylindrical portion 23c toward the outer peripheral side. The suction port forming portion 23f protrudes from the center of the bottom portion 23d to the right side. The axial center of the suction port forming portion 23f formed in a cylindrical shape coincides with the axial center of the fixed shaft 30. A through-hole 23h passing through the bottom portion 23d in the right and left directions is formed at the center of the bottom portion 23d. The through-hole 23h is formed in a circular hole shape. The axial center of the through-hole 23h coincides with the axial center of the suction port forming portion 23f. An inner diameter of the through-hole 23h is the same as the inner diameter of the suction port forming portion 23f. The cooling medium suctioned from the suction port 23a passes through the inner peripheral side of the suction port forming portion 23f and the through-hole 23h.

The shaft holding portion 23e is disposed at the center of the motor 15 in the radial direction. Further, the shaft holding portion 23e is disposed on the left side of the bottom portion 23d. The shaft holding portion 23e is connected to a center portion of the bottom portion 23d. Specifically, the shaft holding portion 23e is connected to the center portion of the bottom portion 23d via three connecting portions 23j. An insertion hole 23k into which the right end of the fixed shaft 30 is inserted and a recessed portion 23n in which the thrust bearing 31 is held are formed in the left end surface of the shaft holding portion 23e. The thrust bearing 31 is disposed between the bearing portion 16a of the impeller 16 and the shaft holding portion 23e in the right and left directions. A gap (thrust play) is formed in at least one of between the thrust bearing 31 and the bearing portion 16a and between the thrust bearing 32 and the bearing portion 16a.

The connecting portions 23j stands upright from the left surface of the bottom portion 23d to the left side. The shaft holding portion 23e is connected to the left ends of the three connecting portions 23j. The three connecting portions 23j are disposed to surround the through-hole 23h. Further, the three connecting portions 23j are disposed at a constant pitch in the circumferential direction of the fixed shaft 30. The cooling medium flowing into the pump chamber 24 passes between the connecting portions 23j in the circumferential direction of the fixed shaft 30.

Two stepped surfaces 23p and 23q which are formed in an annular shape and directed to the left side are formed on the inner circumference side of the cylindrical portion 23c. The right end surface of the motor case 22 is in contact with the stepped surface 23p. Further, the seal member 25 is disposed using the stepped surface 23q. A shape of an inner peripheral surface 23r of the cylindrical portion 23c formed on the right side of the stepped surface 23p when seen in the right and left directions is a circular shape. A shape of each of the inner peripheral surface of the cylindrical portion 23c formed between the stepped surface 23p and the stepped surface 23q and the inner peripheral surface of the cylindrical portion 23c formed on the left side of the stepped surface 23q when seen in the right and left directions is also a circular shape.

A curved surface portion 23s formed by a concave curved surface which connects the left surface of the bottom portion 23d with the inner peripheral surface 23r of the cylindrical portion 23c (specifically, a concave curved surface which smoothly connects the left surface of the bottom portion 23d with the inner peripheral surface 23r of the cylindrical portion 23c) is formed at the boundary between the left surface of the bottom portion 23d and the inner peripheral surface 23r of the cylindrical portion 23c. That is, the inner peripheral surface 23r is connected to the left surface of the bottom portion 23d via the curved surface portion 23s.

The centrifugal pump 6 is fixed to one end of the radiator 4 in the longitudinal direction of the radiator 4. Specifically, the centrifugal pump 6 is fixed to the left end surface of the radiator 4. That is, the centrifugal pump 6 is fixed to the tank chamber 11. The centrifugal pump 6 is fixed to the tank chamber 11 in a state in which a bottom surface 23t that is the right side surface of the bottom portion 23d of the case body 23 faces a left side surface (left surface) 11a of the tank chamber 11. Further, the centrifugal pump 6 is fixed to the tank chamber 11 by screws.

The suction port 23a of the centrifugal pump 6 is connected to the tank chamber 11. That is, the suction side of the centrifugal pump 6 communicates with the inside of the tank chamber 11. As shown in FIG. 4, a through-hole 11b into which the suction port forming portion 23f is inserted is formed in the side surface 11a. The discharge port 23b of the centrifugal pump 6 is connected to one of the two cooling bodies 3 via a pipe 37 formed of a resin tube or the like. The other cooling body 3 of the two cooling bodies 3 is connected to the tank chamber 12 via a pipe 40 formed of a resin tube or the like.

In the centrifugal pump 6, as shown in FIG. 3, an outlet port 24a of the cooling medium in the pump chamber 24 is disposed above the suction port 23a. In the embodiment, when the centrifugal pump 6 is driven, the cooling medium flows in the counterclockwise direction in FIG. 1 as indicated by arrows in FIG. 1, and the cooling medium circulates between the cooling bodies 3 and the radiator 4.

As shown in FIG. 4, An annular seal member 38 which prevents leakage of the cooling medium from a space between the centrifugal pump 6 and the tank chamber 11 is disposed between the bottom surface 23t of the case body 23 and the side surface 11a of the tank chamber 11. The seal member 38 is an O-ring. Therefore, in the following description, the seal member 38 is referred to as "O-ring 38." The O-ring 38 is disposed on the outer peripheral side of the bottom surface 23t to surround the through-hole 23h and the suction port forming portion 23f. Further, the O-ring 38 disposed between the bottom surface 23t of the case body 23 and the side surface 11a is formed to have an annular shape, and the axial center of the O-ring 38 substantially coincides with the axial center of the suction port forming portion 23f. The outer peripheral end portion of the side surface 11a is an annular convex portion 11c which positions the O-ring 38. The convex portion 11c protrudes to the left side.

When seen in the right and left directions, the inner peripheral surface 23r of the cylindrical portion 23c and the O-ring 38 overlap each other. In the embodiment, when seen in the right and left directions, a contact portion CP in which the bottom surface 23t and the O-ring 38 are in contact with each other is disposed radially outward of the cylindrical portion 23c from an inner end of the curved surface portion 23s in the radial direction of the cylindrical portion 23c.

Specifically, in the embodiment, the contact portion CP overlaps the inner peripheral surface 23r when seen in the right and left directions. A shape of the contact portion CP when seen in the right and left directions is substantially annular.

An adhesive 39 for preventing the leakage of the cooling medium from a space between the centrifugal pump 6 and the tank chamber 11 is coated between the bottom surface 23t and the side surface 11a on the inner peripheral side of the seal member 38. The adhesive 39 is coated over the entire periphery of the O-ring 38 on the inner peripheral side of the O-ring 38. Also, the adhesive 39 is coated between the outer peripheral surface of the suction port forming portion 23f and the inner peripheral surface of the O-ring 38.

(Main Effect of this Embodiment)

As described above, in the embodiment, the inner peripheral surface 23r of the cylindrical portion 23c of the case body 23 and the O-ring 38 overlap each other when seen in the right and left directions. Therefore, in the embodiment, the cylindrical portion 23c can receive at least a part of the reaction force of the O-ring 38 crushed between the bottom portion 23d of the case body 23 and the tank chamber 11. Thus, in the embodiment, even when the O-ring 38 is disposed between the bottom surface 23t of the case body 23 and the side surface 11a of the tank chamber 11, it is possible to suppress deformation of the bottom portion 23d of the case body 23, which has a relatively small thickness, in the left direction.

Particularly, in the embodiment, when seen in the right and left directions, the contact portion CP in which the bottom surface 23t and the O-ring 38 are in contact with each other is disposed radially outward of the cylindrical portion 23c from the inner end of the curved surface portion 23s in the radial direction of the cylindrical portion 23c. Specifically, when seen in the right and left directions, the contact portion CP overlaps the inner peripheral surface 23r. Therefore, in the embodiment, more reaction force of the O-ring 38 crushed between the bottom portion 23d of the case body 23 and the tank chamber 11 can be received by the cylindrical portion 23c. Thus, in the embodiment, it is possible to effectively suppress the deformation of the bottom portion 23d, which has the relatively small thickness, in the left direction.

Further, in the embodiment, since it is possible to minimize the deformation of the bottom portion 23d in the leftward direction, it is possible to minimize an amount of shifting of the shaft holding portion 23e connected to the center portion of the bottom portion 23d in the left direction. Therefore, in the embodiment, even when the O-ring 38 is disposed between the bottom surface 23t of the case body 23 and the side surface 11a of the tank chamber 11, it is possible to minimize an amount of reduction in the thrust play between the rotor 19 and the impeller 16 which is formed on least one of between the thrust bearing 31 and the bearing portion 16a held by the shaft holding portion 23e and between the thrust bearing 32 and the bearing portion 16a held by the shaft holding portion 22b, and as a result, it is difficult for a phenomenon in which the rotor 19 and the impeller 16 do not rotate to occur.

Further, in the embodiment, since it is possible to reduce the thickness of the bottom portion 23d while suppressing the deformation of the bottom portion 23d, it is possible to reduce a size of the centrifugal pump 6 in the right and left directions. Therefore, in the embodiment, it is possible to suppress a protrusion amount of the centrifugal pump 6 from the side surface of the radiator 4.

In the embodiment, the adhesive 39 which prevents the leakage of the cooling medium from the space between the centrifugal pump 6 and the tank chamber 11 is coated between the bottom surface 23t and the side surface 11a on the inner peripheral side of the seal member 38. Therefore, in the embodiment, the leakage of the cooling medium from the space between the centrifugal pump 6 and the tank chamber 11 can be effectively prevented.

In the embodiment, the outlet port 24a of the cooling medium in the pump chamber 24 is disposed above the suction port 23a. Therefore, in the embodiment, when the centrifugal pump 6 is activated, air in the pump chamber 24 is easily discharged to the outside of the pump chamber 24. That is, when the centrifugal pump 6 is stopped, since the air in the pump chamber 24 accumulates in an upper portion of the pump chamber 24, when the outlet port 24a of the cooling medium in the pump chamber 24 is disposed above the suction port 23a, it is easy to discharge the air in the pump chamber 24 to the outside of the pump chamber 24 when the centrifugal pump 6 is activated. Therefore, in the embodiment, the air in the pump chamber 24 can be reliably pulled out easily by repeatedly starting and stopping the centrifugal pump 6.

(Another Embodiment)

The above-described embodiment is an example of a preferred embodiment of the disclosure, but the disclosure is not limited thereto, and various modifications can be made without changing the gist of the disclosure.

Figure 6:
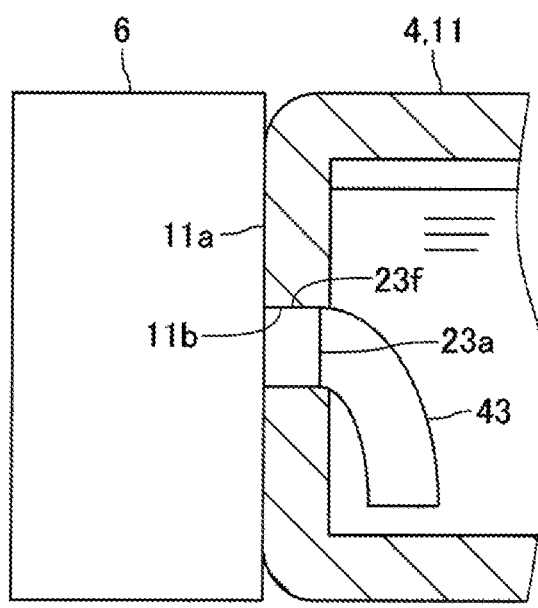
FIG. 6 is a view for explaining a configuration of a connecting portion between the centrifugal pump and the tank chamber according to another embodiment of the disclosure.

In the above-described embodiment, as shown in FIG. 6, one end side of a pipe 43 such as a resin tube disposed inside the tank chamber 11 may be connected to the suction port forming portion 23f of the centrifugal pump 6, and the other end of the pipe 43 may be disposed on the lower end side of the inside of the tank chamber 11. In this case, it is possible to prevent the centrifugal pump 6 from suctioning the air in the tank chamber 11 even when there is the air in the upper portion of the tank chamber 11. In FIG. 6, illustration of the O-ring 38, the adhesive 39, and so on is omitted.

In the above-described embodiment, the contact portion CP may overlap the inner end of the curved surface portion 23s in the radial direction of the cylindrical portion 23c when seen in the right and left directions and may be disposed radially inward of the cylindrical portion 23c from the inner end of the curved surface portion 23s in the radial direction of the cylindrical portion 23c. Further, in the above-described embodiment, when seen in the right and left directions, the contact portion CP may be disposed radially outward of the cylindrical portion 23c from the inner end of the curved surface portion 23s in the radial direction of the cylindrical portion 23c and also radially inward of the cylindrical portion 23c from the inner peripheral surface 23r.

Further, in the above-described embodiment, the contact portion CP may be disposed outward from the inner peripheral surface 23r of the cylindrical portion 23c in the radial direction of the cylindrical portion 23c when seen in the right and left directions. In this case, it is possible for the cylindrical portion 23c to receive the entire reaction force of the O-ring 38 crushed between the bottom surface 23t of the case body 23 and the side surface 11a of the tank chamber 11. Therefore, the deformation of the bottom portion 23d can be more effectively suppressed.

In the above-described embodiment, the seal member 38 may be an annular seal member other than the O-ring. Further, in the above-described embodiment, the adhesive 39 may be coated only between the bottom surface 23t and the side surface 11a on the inner peripheral side of the O-ring 38. In this case, a space portion formed by a stepped portion 23u serves as an adhesive reservoir portion capable of storing the excessive adhesive 39. Further, in the above-described embodiment, the adhesive 39 may not be coated between the bottom surface 23t and the side surface 11a on the inner peripheral side of the seal member 38. Further, in the above-described embodiment, the motor 15 may have a rotating shaft to which the impeller 16 is fixed, instead of the fixed shaft 30. In this case, the rotating shaft is a rotation center shaft which is the rotation center of the impeller 16 and the rotor 19.

In the above-described embodiment, the outlet port 24a of the cooling medium in the pump chamber 24 may be disposed at the same height as that of the suction port 23a or may be disposed below the suction port 23a. Further, in the above-described embodiment, the two cooling bodies 3 may be connected in parallel to the radiator 4. Furthermore, in the above-described embodiment, the number of the cooling bodies 3 provided in the cooling device 1 may be one, or three or more. Also, in the above-described embodiment, the longitudinal direction of the radiator 4 may be inclined with respect to the horizontal direction. Also, in the above-described embodiment, the heat-generating components 2 may be components other than the electronic components.

In the cooling device of the disclosure, the annular seal member for preventing leakage of the cooling medium from a space between the centrifugal pump and the tank chamber is disposed between the bottom surface of the bottom portion of the case body of the centrifugal pump formed in a bottomed cylindrical shape and the side surface of the tank chamber of the radiator (that is, the side surface of the radiator). Further, in the disclosure, the inner circumferential surface of the cylindrical portion connected to the surface of the bottom portion of the case body on the side in the second direction overlaps the annular seal member when seen in the axial direction of the rotation center shaft.

Thus, in the disclosure, at least a part of a reaction force of the seal member crushed between the bottom surface of the bottom portion of the case body and the side surface of the tank chamber can be received by the cylindrical portion of the case body. Accordingly, in the disclosure, even when the seal member is disposed between the bottom portion of the case body and the side surface of the radiator, it is possible to suppress deformation of the bottom portion of the case body (specifically, deformation of the bottom portion in the second direction) which has a thin thickness.

Also, in the disclosure, since it is possible to suppress deformation of the bottom portion of the case body in the second direction, even when the seal member is disposed between the bottom portion of the case body and the side surface of the radiator, it is possible to minimize an amount of shifting of the shaft holding portion connected to a center portion of the bottom portion in the second direction. Therefore, in the disclosure, even when the seal member is disposed between the bottom portion of the case body and the side surface of the radiator, it is possible to minimize an amount of reduction in thrust play between the rotor and the impeller, and as a result, it is difficult for a phenomenon in which the rotor and the impeller do not rotate to occur.

Also, in the disclosure, since it is possible to reduce the thickness of the bottom portion while suppressing deformation of the bottom portion of the case body, it is possible to reduce a size of the centrifugal pump in the axial direction of the rotation center shaft. Therefore, in the disclosure, it is possible to suppress a protruding amount of the centrifugal pump from the side surface of the radiator.

In the disclosure, for example, the rotation center shaft may be a fixed shaft which rotatably supports the rotor and the impeller, a bearing portion through which the rotation center shaft is inserted may be formed on the impeller, and a thrust bearing may be disposed between the bearing portion and the shaft holding portion in the axial direction of the rotation center shaft. In this case, it is possible to suppress the reduction amount of thrust play between the bearing portion of the impeller and the thrust bearing.

In the disclosure, the seal member may be, for example, an O-ring. In this case, it is easy to secure adhesion between the bottom surface of the bottom portion of the case member and the seal member and adhesion between the side surface of the tank chamber and the seal member over the entire periphery of the seal member. Therefore, leakage of the cooling medium from the space between the centrifugal pump and the tank chamber can be easily prevented over the entire periphery of the seal member.

In the disclosure, a curved surface portion formed by a concave curved surface which connects the surface of the bottom portion on the side in the second direction with the inner peripheral surface of the cylindrical portion may be formed at a boundary between a surface of the bottom portion on the side in the second direction and the inner peripheral surface of the cylindrical portion, and a contact portion in which the bottom surface of the bottom portion and the O-ring are in contact with each other may be disposed farther outwardly in a radial direction of the cylindrical portion than an inner end of the curved surface portion in the radial direction of the cylindrical portion when seen in the axial direction of the rotation center shaft. With such a configuration, the cylindrical portion of the case body can receive more reaction force of the seal member crushed between the bottom surface of the bottom portion of the case body and the side surface of the tank chamber. Therefore, it is possible to effectively suppress deformation of the bottom portion of the case body which has a thin thickness.

In the disclosure, the contact portion in which the bottom surface of the bottom portion and the O ring are in contact with each other may overlap the inner peripheral surface of the cylindrical portion when seen in the axial direction of the rotation center shaft. With such a configuration, the cylindrical portion of the case body can receive more reaction force of the seal member crushed between the bottom surface of the bottom portion of the case body and the side surface of the tank chamber. Therefore, it is possible to effectively suppress deformation of the bottom portion of the case body which has a thin thickness.

In the disclosure, the contact portion in which the bottom surface of the bottom portion and the O-ring are in contact with each other may be disposed outward from the inner peripheral surface of the cylindrical portion in the radial direction of the cylindrical portion when seen in the axial direction of the rotation center shaft. With such a configuration, the cylindrical portion of the case body can receive all of the reaction force of the seal member crushed between the bottom surface of the bottom portion of the case body and the side surface of the tank chamber. Therefore, it is possible to effectively suppress deformation of the bottom portion of the case body which has a thin thickness.

In the disclosure, an adhesive which prevents leakage of the cooling medium from a space between the centrifugal pump and the tank chamber may be coated between the bottom surface of the bottom portion and the side surface of the tank chamber on an inner peripheral side of the seal member. With such a configuration, it is possible to effectively prevent leakage of the cooling medium from the space between the centrifugal pump and the tank chamber.

In the disclosure, the radiator may be formed in an elongated rectangular parallelepiped shape and disposed so that a longitudinal direction of the radiator and a horizontal direction coincide with each other, the tank chamber may constitute one end portion of the radiator in the longitudinal direction of the radiator, the centrifugal pump may be fixed to one end of the radiator in the longitudinal direction of the radiator, a pump chamber through which the cooling medium suctioned from the suction port passes toward the discharge port may be formed in the centrifugal pump, and an outlet port of the cooling medium in the pump chamber may be disposed above the suction port. With such a configuration, when the centrifugal pump is stopped, air in the pump chamber accumulates in an upper portion of the pump chamber, and thus it is easy to discharge the air in the pump chamber outside of the pump chamber when the centrifugal pump is activated. Therefore, the air in the pump chamber can be reliably drawn out easily by repeatedly starting and stopping the centrifugal pump.

In the disclosure, the radiator may be formed in an elongated rectangular parallelepiped shape and disposed so that a longitudinal direction of the radiator and a horizontal direction coincide with each other, the tank chamber may constitute one end portion of the radiator in the longitudinal direction of the radiator, the centrifugal pump may be fixed to one end of the radiator in the longitudinal direction of the radiator, one end side of a pipe disposed inside the tank chamber may be connected to a suction port forming portion of the centrifugal pump in which the suction port is formed, and the other end of the pipe may be disposed on a lower end side of an inside of the tank chamber. With such a configuration, it is possible to prevent the centrifugal pump from suctioning the air in the tank chamber even when there is air in the upper portion of the tank chamber.

As described above, in the cooling device of the disclosure which has the centrifugal pump directly mounted on the side surface of the radiator, even when an annular seal member for preventing leakage of the cooling medium is disposed between the bottom portion of the case body of the centrifugal pump formed in the bottomed cylindrical shape and the side surface of the radiator, it is possible to suppress deformation of the bottom portion of the case body having a thin thickness.

What is claimed is:

1. A cooling device comprising:
    a cooling plate, mounted on a heat-generating electronic component and configured such that a cooling medium can flow through the cooling plate as a cooling liquid for cooling the heat-generating electronic component;
    a radiator, configured to cool the cooling medium heated by the cooling plate and comprising a plurality of cooling pipes, a plurality of heat radiation fins and a tank chamber, wherein the cooling medium can flow within the plurality of cooling pipes, the plurality of heat radiation fins are connected to outer peripheral surfaces of the cooling pipes, and ends of the plurality of cooling pipes are connected to the tank chamber; and
    a centrifugal pump, disposed to circulate the cooling medium between the cooling plate and the radiator and comprising a motor, an impeller and a case body, wherein the motor is provided with a rotor and a stator, wherein the impeller is fixed to the rotor and rotated by the power of the motor, and wherein a suction port and a discharge port are formed in the case body for suctioning and discharging the cooling medium,
    wherein the motor is configured such that a rotation center shaft serves as a rotation center of the rotor and the impeller,
    wherein the case body includes a cylindrical portion formed in a cylindrical shape and a bottom portion configured to close one end of the cylindrical portion,
    wherein an axial direction of the cylindrical portion coincides with the axial direction of the rotation center shaft,
    wherein an end of the rotation center shaft supported via a shaft holder formed in the case body and connected to the bottom portion,
    wherein the bottom portion of the case body is configured to suction the cooling medium suctioned from the suction port via a through-hole formed at the bottom portion,
    wherein the centrifugal pump is fixed to the tank chamber and the tank chamber is located between the centrifugal pump and the radiator such that a bottom surface of the bottom portion faces a side surface of the tank chamber,
    wherein the cooling device further comprises an annular seal member disposed between the case body and the tank chamber and configured to surround the through-hole in order to prevent leakage of the cooling medium from a space between the centrifugal pump and the tank chamber, and
    wherein the case body is configured such that an inner peripheral surface of the cylindrical portion is connected to a surface of the bottom portion and the inner peripheral surface of the cylindrical portion is overlapped with the annular seal member in the axial direction of the rotation center shaft.

2. The cooling device according to claim 1, wherein the rotation center shaft is a fixed shaft which is configured to rotatably support the rotor and the impeller,
    a bearing portion is formed in a cylindrical shape and configured such that another end of the rotation center shaft is inserted through the bearing portion, wherein the bearing portion is formed in the impeller, and
    a thrust bearing is disposed between the bearing portion and the shaft holder in the axial direction of the rotation center shaft.

3. The cooling device according to claim 1, wherein the annular seal member is an O-ring.

4. The cooling device according to claim 3, wherein the case body is configured such that a curved surface portion formed by a concave curved surface which connects the surface of the bottom portion with the inner peripheral surface of the cylindrical portion is formed at a boundary between the surface of the bottom portion and the inner peripheral surface of the cylindrical portion, and
    the bottom surface of the bottom portion and the O-ring are in contact with each other at a contact portion farther outwardly in a radial direction of the cylindrical portion than an inner end of the curved surface portion in the radial direction of the cylindrical portion.

5. The cooling device according to claim 3, wherein the case body is configured such that the bottom surface of the bottom portion is in contact with the O ring at a contact portion where the contact portion overlaps the inner peripheral surface of the cylindrical portion in the axial direction of the rotation center shaft.

6. The cooling device according to claim 3, wherein the case body is configured such that the bottom surface of the bottom portion and the O-ring are in contact with each other at a contact portion located outward from the inner peripheral surface of the cylindrical portion in a radial direction of the cylindrical portion.

7. The cooling device according to claim 1, wherein the cooling device is configured such that an adhesive is coated between the bottom surface of the bottom portion and the side surface of the tank chamber on an inner peripheral side of the annular seal member in order to prevent leakage of the cooling medium from the space between the centrifugal pump and the tank chamber.

8. The cooling device according to claim 1, wherein the radiator is formed in an elongated rectangular parallelepiped shape and disposed so that a longitudinal direction of the radiator and a horizontal direction coincide with each other,
wherein the tank chamber is configured to constitute one end portion of the radiator in the longitudinal direction of the radiator,
wherein the centrifugal pump is fixed to one end of the radiator in the longitudinal direction of the radiator,
wherein the centrifugal pump includes a pump chamber, wherein the cooling medium suctioned from the suction port can flow within the pump chamber and can be discharged via the discharge port, and
wherein an outlet port of the cooling medium in the pump chamber is disposed above the suction port.

9. The cooling device according to claim 1, wherein the radiator is formed in an elongated rectangular parallelepiped shape and disposed so that a longitudinal direction of the radiator and a horizontal direction coincide with each other,
wherein the tank chamber is configured to constitute one end portion of the radiator in the longitudinal direction of the radiator,
wherein the centrifugal pump is fixed to one end of the radiator in the longitudinal direction of the radiator,
wherein the cooling device further comprises a pipe, wherein one end side of the pipe disposed inside the tank chamber is connected to a cylindrical suction port forming portion in which the suction port is formed, and
wherein the other end of the pipe is disposed on a lower end side of an inside of the tank chamber.

* * * * *